US009122452B2

(12) United States Patent
Noborio

(10) Patent No.: US 9,122,452 B2
(45) Date of Patent: Sep. 1, 2015

(54) ELECTRONIC DEVICE

(75) Inventor: Masaki Noborio, Kato (JP)

(73) Assignee: FUJITSU LIMITED, Kawasaki (JP)

( * ) Notice: Subject to any disclaimer, the term of this patent is extended or adjusted under 35 U.S.C. 154(b) by 192 days.

(21) Appl. No.: 13/480,379

(22) Filed: May 24, 2012

(65) Prior Publication Data

US 2012/0314366 A1  Dec. 13, 2012

(30) Foreign Application Priority Data

Jun. 9, 2011  (JP) .................................. 2011-129076

(51) Int. Cl.
| G06F 1/20 | (2006.01) |
|---|---|
| H05K 5/00 | (2006.01) |
| H05K 7/20 | (2006.01) |
| G06F 1/16 | (2006.01) |
| H05K 7/16 | (2006.01) |
| H05K 1/14 | (2006.01) |
| H05K 1/02 | (2006.01) |
| H05K 1/18 | (2006.01) |

(52) U.S. Cl.
CPC .............. *G06F 1/1658* (2013.01); *G06F 1/203* (2013.01); *H05K 1/0209* (2013.01); *H05K 1/184* (2013.01); *H05K 1/0271* (2013.01); *H05K 1/183* (2013.01); *H05K 5/00* (2013.01); *H05K 5/006* (2013.01); *H05K 5/0026* (2013.01); *H05K 5/0047* (2013.01); *H05K 5/0069* (2013.01); *H05K 7/20* (2013.01); *H05K 7/20136* (2013.01); *H05K 7/20172* (2013.01)

(58) Field of Classification Search
CPC ... H05K 1/0209; H05K 1/0271; H05K 1/183; H05K 1/184; H05K 7/20; H05K 7/20136; H05K 7/20172; H05K 5/00; H05K 5/0026; H05K 5/0047; H05K 5/006; H05K 5/0069; G06F 1/203

USPC ......... 391/692, 687, 688, 694, 695, 697, 704, 391/720, 725, 736, 748, 752, 760, 761, 777, 391/779, 829, 831; 361/679.46–679.5, 361/679.54, 679.55, 679.56
See application file for complete search history.

(56) References Cited

U.S. PATENT DOCUMENTS

| 3,660,726 A * | 5/1972 | Ammon et al. ................ 174/262 |
|---|---|---|
| 6,865,074 B2 * | 3/2005 | Lehtonen et al. ......... 361/679.46 |

(Continued)

FOREIGN PATENT DOCUMENTS

| JP | 62-257786 A | 11/1987 |
|---|---|---|
| JP | 09-214077 A | 8/1997 |
| JP | 09-258849 A | 10/1997 |
| JP | 2006-032697 A | 2/2006 |

(Continued)

OTHER PUBLICATIONS

JPOA Office Action of Japanese Patent Application No. 2011-129076 dated Mar. 3, 2015 with Partial Translation.

*Primary Examiner* — Courtney Smith
*Assistant Examiner* — Zhengfu Feng
(74) *Attorney, Agent, or Firm* — Maschoff Brennan

(57) ABSTRACT

An electronic device includes a printed circuit board, a heat generating component disposed on the printed circuit board, and a casing including the printed circuit board and the heat generating component, the casing allowing an air flow to flow from an outside to an inside of the casing. The printed circuit board includes a first and second openings and an extending portion formed between the first and second openings so as to extend in a flow direction of the air flow in the casing, and the extending portion includes a conductive pattern and is located opposite the heat generating component.

9 Claims, 12 Drawing Sheets

(56) References Cited

U.S. PATENT DOCUMENTS 6,934,150 B2 * 8/2005 Kitchen et al. ........... 361/679.33
7,755,896 B2 * 7/2010 Tamaki et al. ................ 361/704

FOREIGN PATENT DOCUMENTS

| JP | 2009-266885 A | 11/2009 |
| WO | 2011/024319 A1 | 3/2011 |

* cited by examiner

ELECTRONIC DEVICE

CROSS-REFERENCE TO RELATED APPLICATION

This application is based upon and claims the benefit of priority of the prior Japanese Patent Application No. 2011-129076, filed on Jun. 9, 2011, the entire contents of which are incorporated herein by reference.

FIELD

The embodiment discussed herein is related to an electronic device.

BACKGROUND

A known electronic device includes a printed circuit board, a component that generates heat (heat-generating component), and a casing that houses the printed circuit board and the heat-generating component. Examples of such an electronic device are disclosed in Japanese Laid-open Patent Publications Nos. 09-258849 and 62-257786.

In an electronic device, the heat of the heat-generating component is transmitted to the printed circuit board, if the printed circuit board and the heat-generating component are arranged close to each other. When traveling along the printed circuit board in a certain direction, the heat may reach a part that resists heat dissipation. In this case, the temperature of the printed circuit board may increase. Further, the temperature of the interior of the casing may also increase.

SUMMARY

According to an aspect of the invention, an electronic device includes a printed circuit board, a heat generating component disposed on the printed circuit board, and a casing including the printed circuit board and the heat generating component, the casing allowing an air flow to flow from an outside to an inside of the casing, wherein the printed circuit board includes a first and second openings and an extending portion formed between the first and second openings so as to extend in a flow direction of the air flow in the casing, and the extending portion includes a conductive pattern and is located opposite the heat generating component.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENT

In an electronic device, the heat of the heat-generating component is transmitted to the printed circuit board, if the printed circuit board and the heat-generating component are arranged close to each other. When traveling along the printed circuit board in a certain direction, the heat may reach a part that resists heat dissipation. In this case, the temperature of the printed circuit board may increase. Further, the temperature of the interior of the casing may also increase.

Figure 1A:
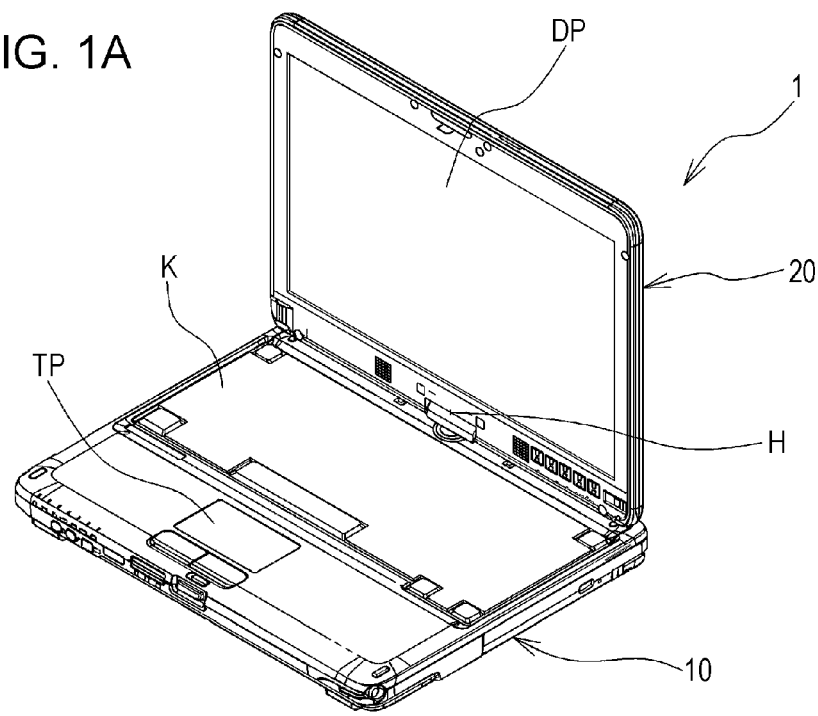
FIG. 1A is a schematic view illustrating a notebook computer that is an example of an electronic device according to this embodiment, as seen from the top.
Figure 1B:
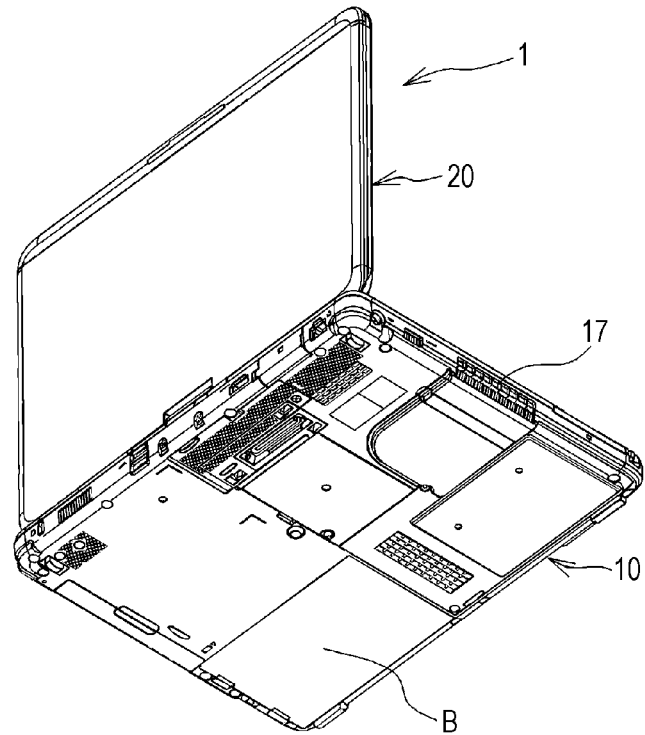
FIG. 1B is a schematic view illustrating the notebook computer, as seen from the bottom.

Hereinafter, a description will be given of a notebook computer that is an example of an electronic device according to this embodiment. FIGS. 1A, 1B, 2A and 2B illustrate a notebook computer 1 of this embodiment. The notebook computer 1 is provided with lower casing 10 and upper casing 20. The lower casing 10 and upper casing 20 are coupled to each other through a bi-axial hinge H. With this bi-axial hinge H, the lower casing 10 and upper casing 20 are coupled to be relatively rotatable around the two axes orthogonal to each other. The lower casing 10 is provided with a keyboard K and a touch pad TP for operating the notebook computer 1. The lower casing 10 contains a printed circuit board for controlling the whole operation of the notebook computer 1, and the upper casing 20 is provided with a display DP. This display DP includes a display panel enabling the display of images, and a touch panel enabling a touch operation. As illustrated in FIG. 1B, an outlet 17 is formed on the left-side surface of the lower casing 10. In FIGS. 1A and 1B, the lower casing 10 and upper casing 20 of the notebook computer 1 are in an open state.

Figure 2A:
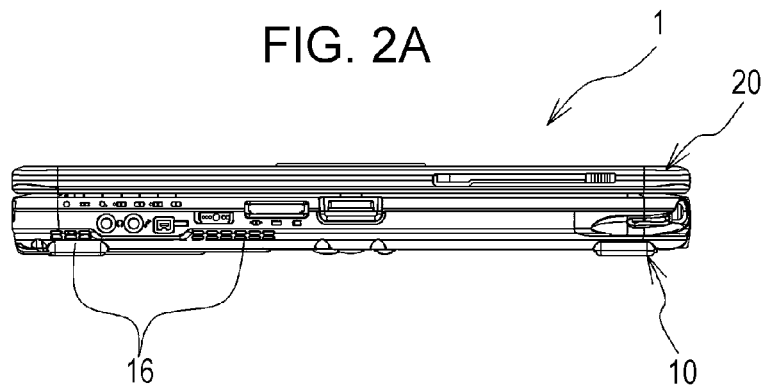
FIG. 2A is a view illustrating a front-side surface of the notebook computer.
Figure 2B:
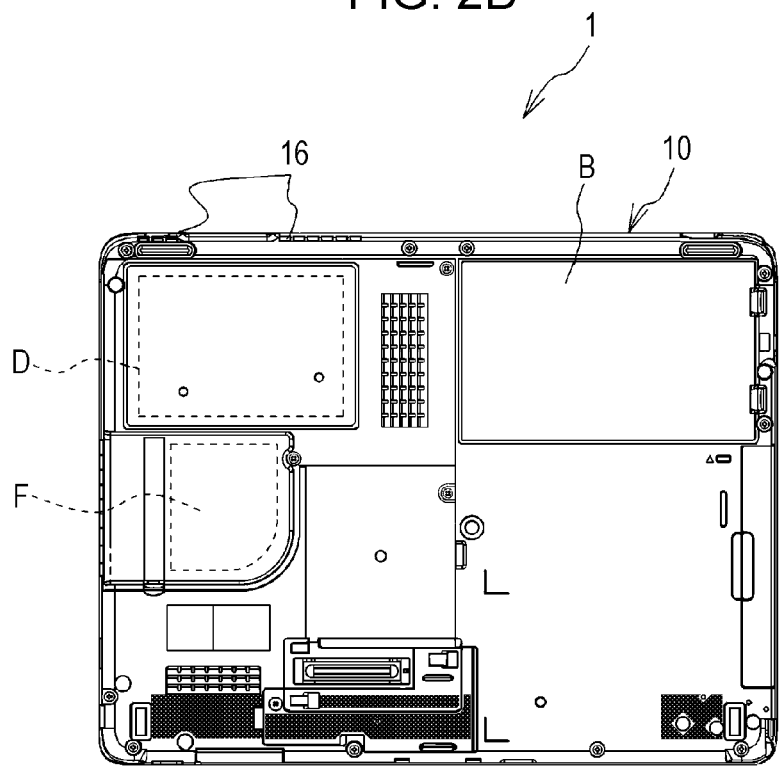
FIG. 2B is a view illustrating a bottom surface of the notebook computer.

FIGS. 2A and 2B illustrate the lower casing 10 and upper casing 20 of the notebook computer 1 in a closed state. FIG. 2A illustrates a front-side surface of the notebook computer 1, and FIG. 2B illustrates a bottom surface of the lower casing 10. As illustrated in FIG. 2A, two outlets 16 and 16 are provided on the front-side surface of the lower casing 10. In addition, a headphone terminal, a microphone terminal, and a data transmission interface are provided between the outlets 16 and 16 on the front-side surface of the lower casing 10. As illustrated in FIG. 2B, the lower casing 10 contains a hard disk drive D and a fan F. The driving of the fan F causes air to flow through the lower casing 10. In addition, a battery B is provided on the bottom surface of the lower casing 10.

Figure 3:
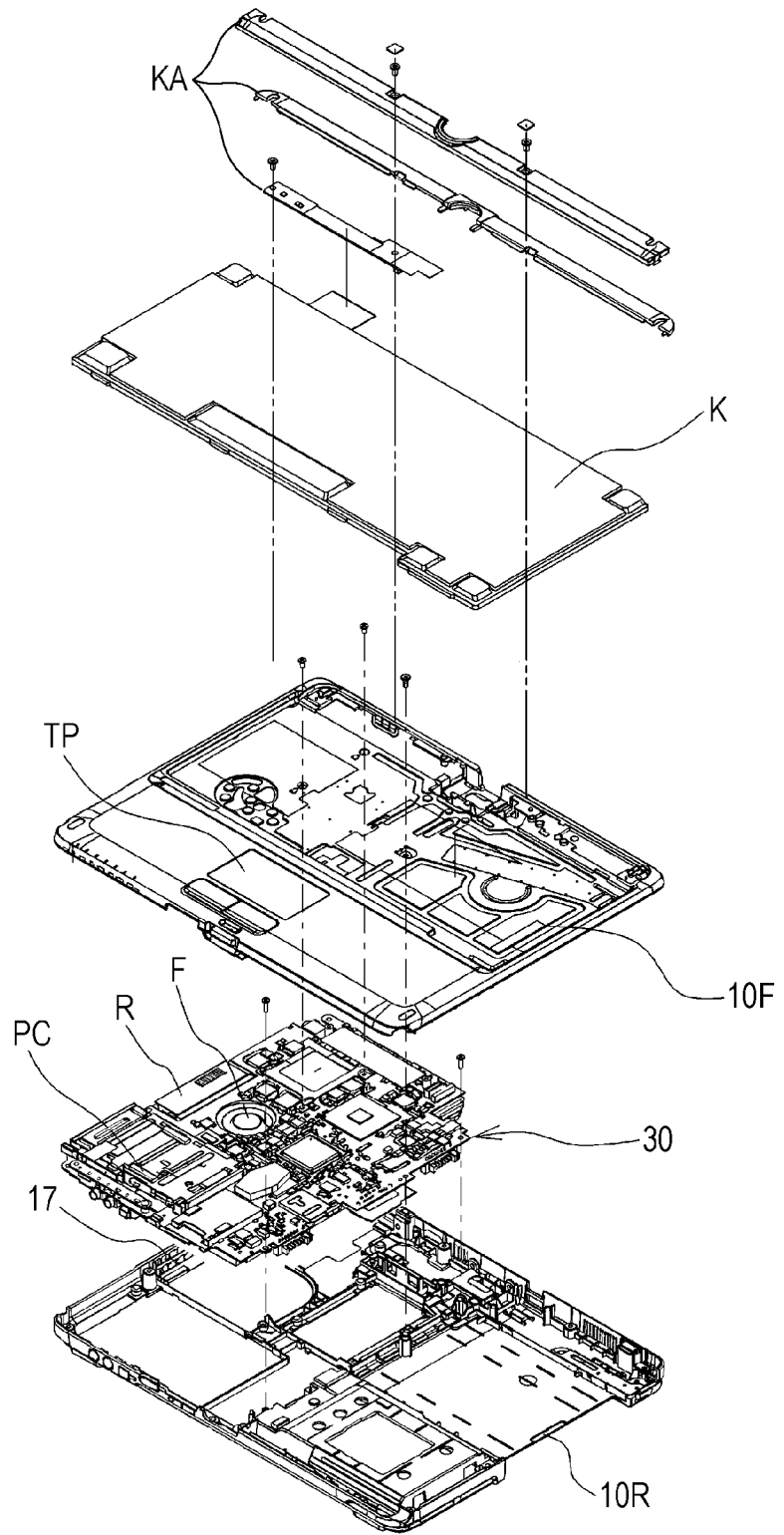
FIG. 3 is an exploded perspective view illustrating the notebook computer.

FIG. 3 is an exploded perspective view illustrating the lower casing 10. This lower casing 10 includes a front case 10F and a rear case 10R that are provided on the upper and bottom sides, respectively. The touch pad TP is provided on a front surface of the front case 10F, and the keyboard K is fixed thereto. This keyboard K is fixed to the front case 10F by multiple attachment parts KA. The lower casing 10 contains a printed circuit board 30 within a storage space thereof. On this printed circuit board 30, a CPU (central processing unit) 40 (described later) and a memory M are mounted. Although not fixed to the printed circuit board 30 directly, a card connector PC is fixed to the front case 10F while facing the printed circuit board 30. The card connector PC enables insertion of a PC card. The fan F is fixed to the printed circuit board 30 through predetermined members.

Figure 4:
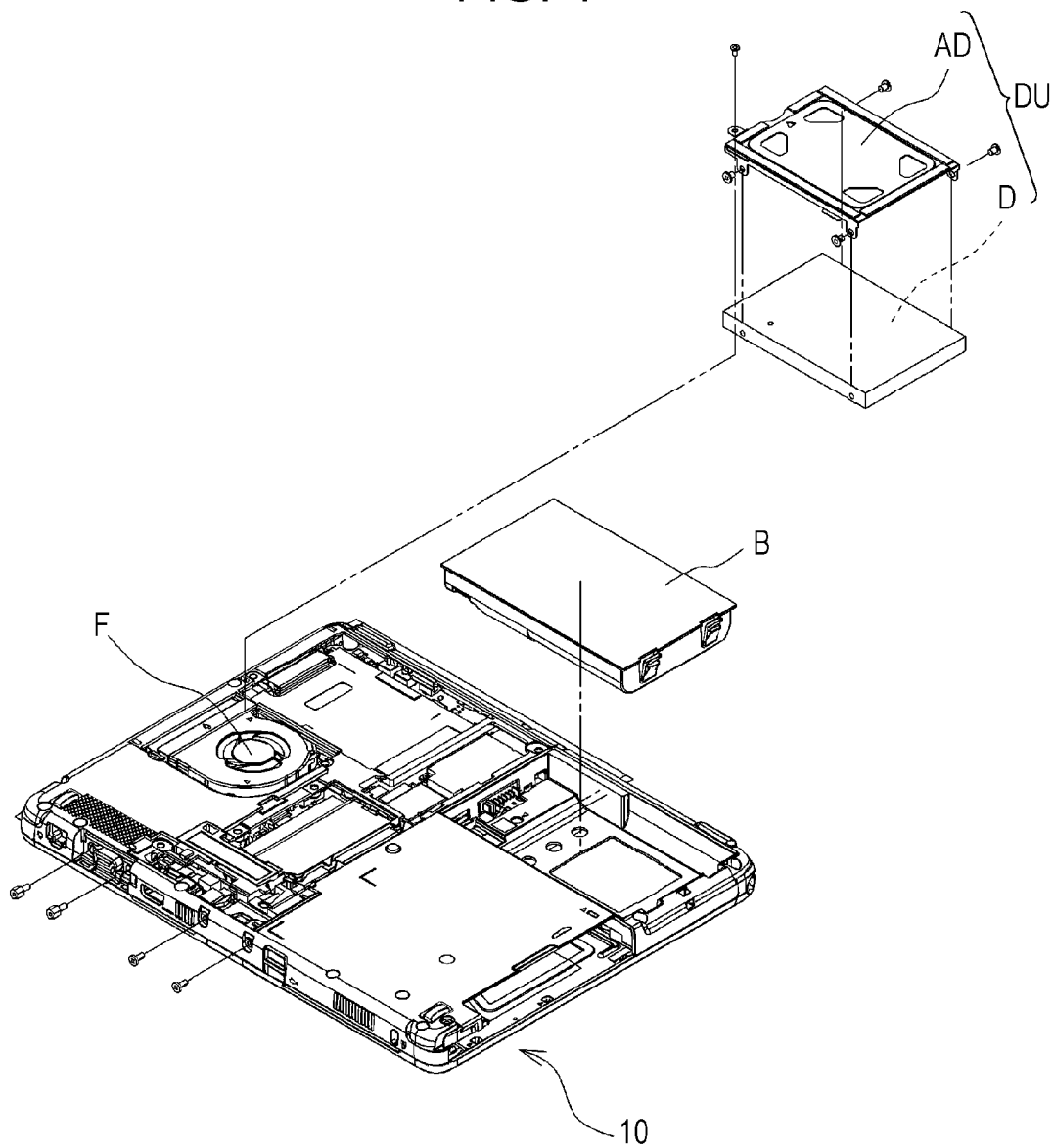
FIG. 4 is an exploded perspective view illustrating the bottom surface of the notebook computer.

FIG. 4 is an exploded perspective view illustrating the bottom surface of the lower casing 10. When a predetermined cover is detached from the rear case 10R of the lower casing 10, the fan F is exposed, and in this state, a drive unit DU may be detached from the lower casing 10. This drive unit DU includes the hard disk drive D and an attachment component AD for fixing the hard disk drive D to the rear case 10R.

Figure 5:
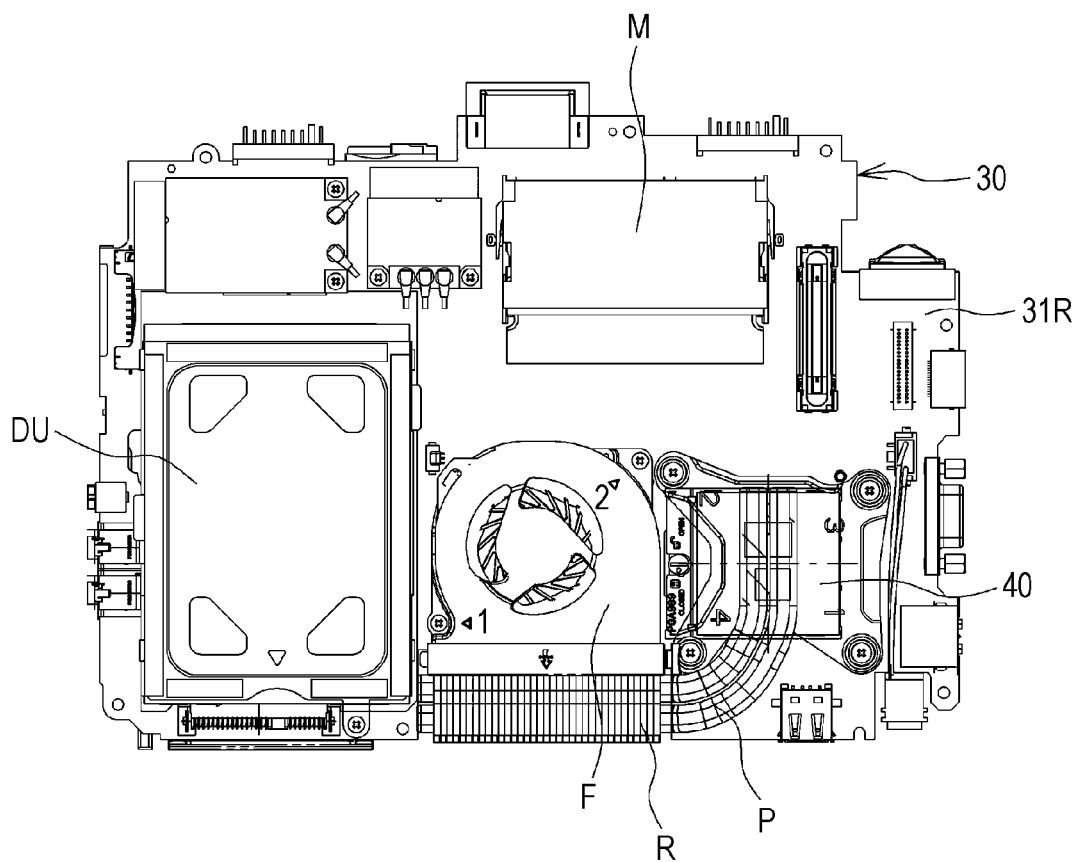
FIG. 5 is a view illustrating a rear surface of a printed circuit board in the notebook computer.

FIG. 5 is a view illustrating a rear surface of the printed circuit board 30. FIG. 5 is a view illustrating a rear surface 31R of the printed circuit board 30 when the printed circuit board 30 is contained in the lower casing 10. This rear surface 31R is located opposite the rear case 10R. The fan F is fixed to the rear surface 31R of the printed circuit board 30. In addition, the CPU 40 is mounted on the rear surface 31R. This CPU 40 is thermally coupled to an end of a pipe P. The other end of this pipe P is thermally coupled to a heat sink R. Accordingly, the heat generated by the CPU 40 is transmitted to the heat sink R through the pipe P. An example of the pipe P is a heat pipe. The fan F includes an impeller, a motor and a case housing the impeller and the motor. The impeller uses, as a rotation axis thereof, the rotation axis of the motor, and is provided with multiple blades around this rotation axis. The impeller is rotated by the driving of the motor. The fan F absorbs air vertically along the rotation axis, and blows the air in the directions that intersect the rotation axis. Accordingly, the fan F delivers the air to the heat sink R. An example of the fan F is a centrifugal fan. With this fan F, heat dissipation through the heat sink R is promoted. The air delivered to the heat sink R is exhausted to the outside of the lower casing 10 through an outlet 17 which is depicted in FIG. 1B.

Figure 6:
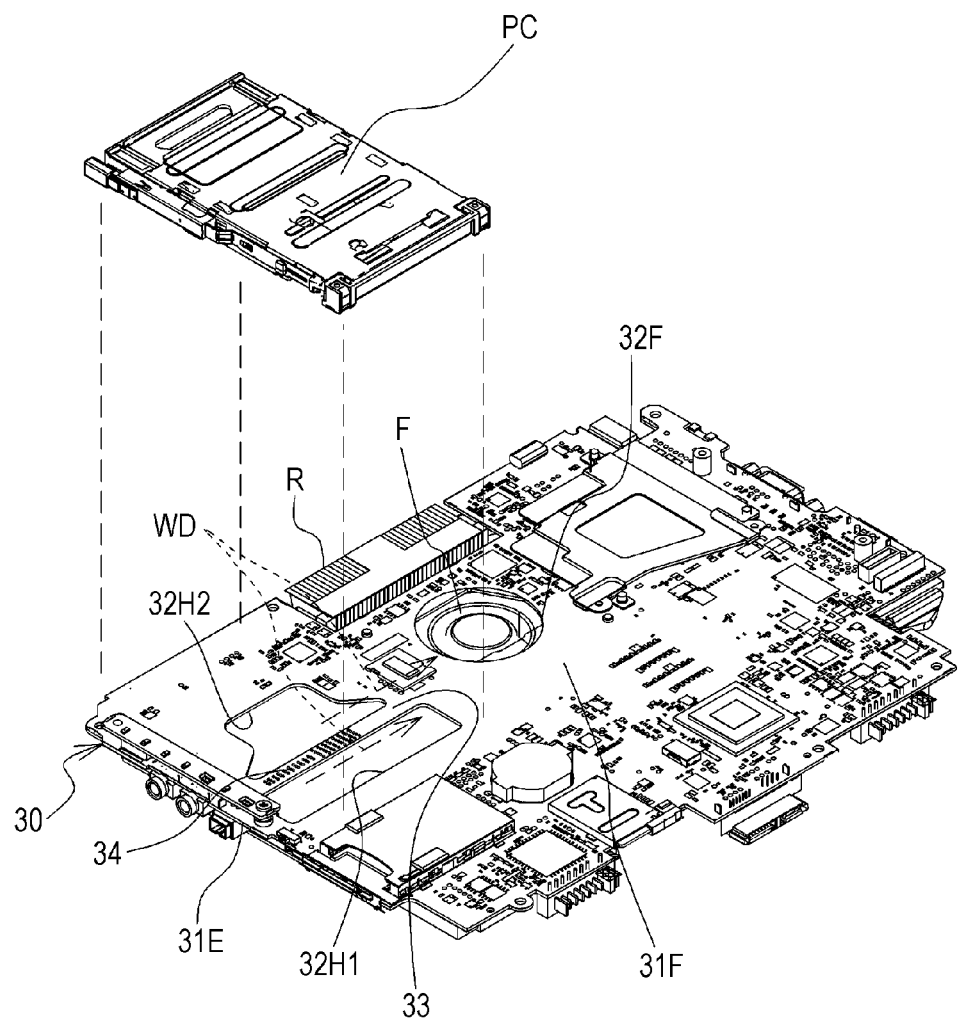
FIG. 6 is a schematic view illustrating the printed circuit board, as seen from a front side thereof.

FIG. 6 is a schematic view illustrating a front surface 31F of the printed circuit board 30. Above the front surface 31F, the card connector PC is located. Specifically, this card connector PC is fixed to the front case 10F while facing the front surface 31F. In FIG. 6, the card connector PC is separated from the printed circuit board 30. In the region of the printed circuit board 30 which is opposite the card connector PC, two openings 32H1 and 32H2 and a longitudinally extending portion 33 are provided. These openings 32H1 and 32H2 penetrate the printed circuit board 30, and are formed independently of each other. The longitudinally extending portion 33 is located between openings 32H1 and 32H2. Each of the openings 32H1 and 32H2 and the longitudinally extending portion 33 may have a shape different from that illustrated in FIG. 6. Each of the openings 32H1 and 32H2 is at least larger than a typical through-hole. The openings 32H1 and 32H2 are an example of first and second relief portions, or first and second openings, respectively. In the printed circuit board 30, a relief opening 32F through which air absorbed by the fan F passes is provided. The fan F is placed opposite this relief opening 32F. Thus, air above the front surface 31F of the printed circuit board 30 may flow into the fan F through the relief opening 32F.

Figure 7:
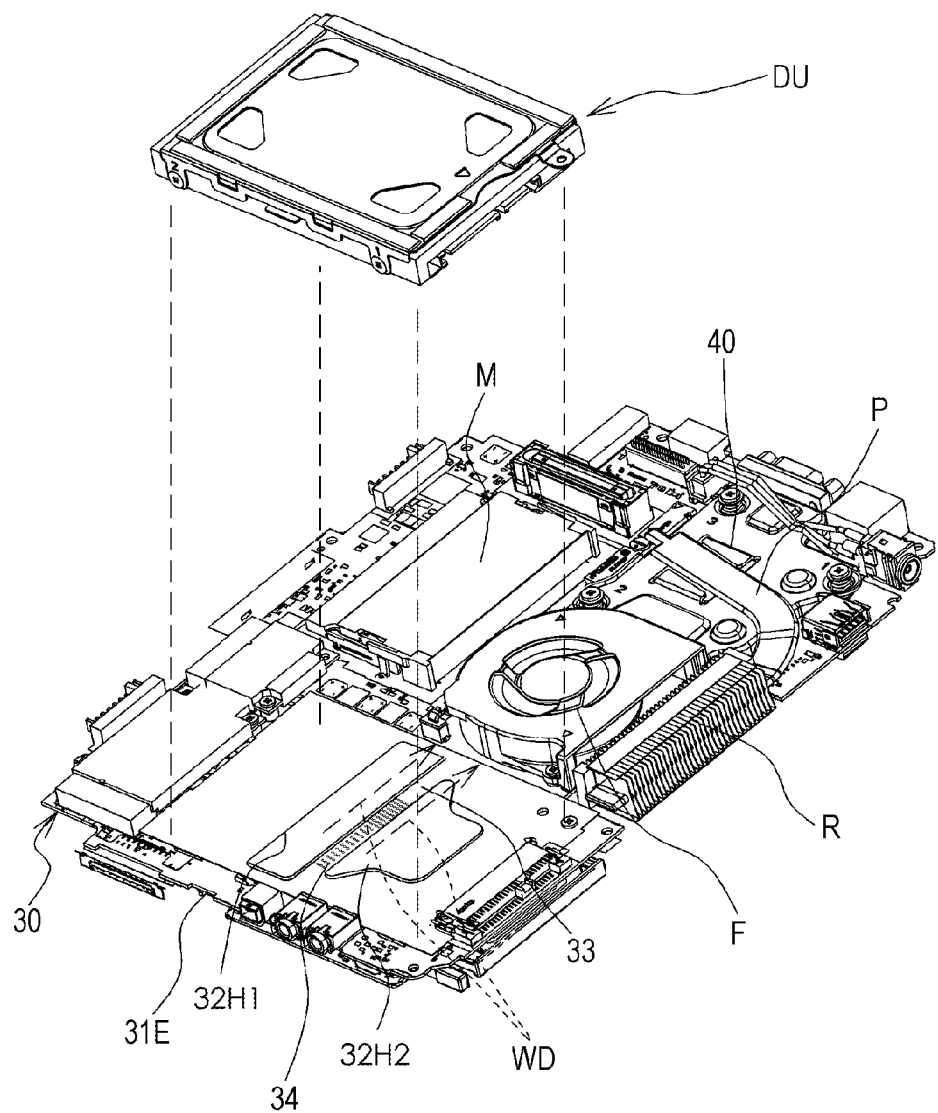
FIG. 7 is a schematic view illustrating the printed circuit board, as seen from a rear side thereof.

FIG. 7 is a schematic view illustrating the rear surface 31R of the printed circuit board 30. As described above, the drive unit DU is mounted on the rear surface 31R. In FIG. 7, the drive unit DU is separated from the printed circuit board 30. In a region of the printed circuit board 30 which is opposite the drive unit DU, the openings 32H1 and 32H2 and the longitudinally extending portion 33 are provided. The longitudinally extending portion 33 is formed extending in a direction from the fan F to an edge 31E. In addition, this longitudinally extending portion 33 extends in a direction orthogonal to the edge 31E. This edge 31E is formed facing the side surface of the lower casing 10 on which the outlets 16 and 16 are provided. In other words, the longitudinally extending portion 33 extends from the fan F toward the outlets 16 and 16. The longitudinally extending portion 33 has multiple through-holes 34 formed therein. Details thereof will be described later.

FIGS. 6 and 7 illustrate a direction WD of an air flow, which the fan F produces, above the longitudinally extending portion 33. To be precise, this air flow direction WD is aligned with a straight line drawn by directly connecting the locations of the fan F and the center of the outlets 16 and 16. The longitudinally extending portion 33 extends substantially in this air flow direction WD. Note that the direction where the longitudinally extending portion 33 extends is not necessary to be orthogonal to the edge 31E. For example, the longitudinally extending portion 33 may extend in a direction that forms any angle other than a right angle with the edge 31E. Specifically, the direction where the longitudinally extending portion 33 extends may extend along a straight line drawn by directly connecting the locations of the fan F and either one of the outlets 16 and 16. Thus, the longitudinally extending portion 33 may extend from a hotter region to a cooler region. In this embodiment, for example, the longitudinally extending portion 33 is formed on the printed circuit board 30, so as to extend from a hot region to the side surface of the lower casing 10 on which the outlets 16 and 16 are provided. This side surface is the coolest region, because external air flows into the side surface by the driving of the fan F.

Figure 8:
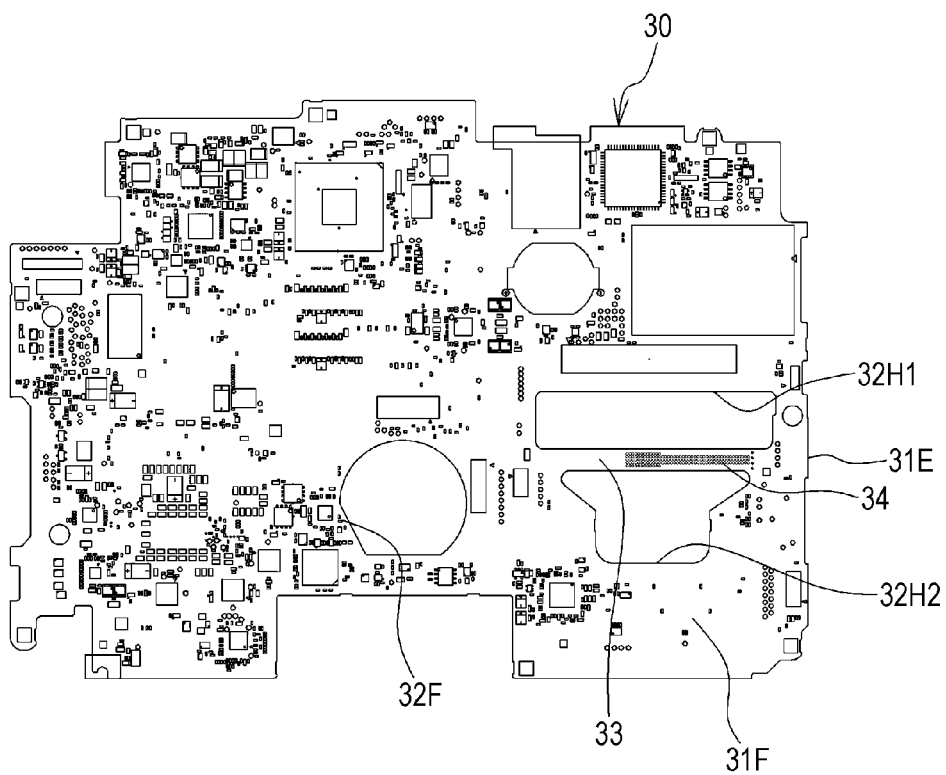
FIG. 8 is a view illustrating a front surface of the printed circuit board.
Figure 9:
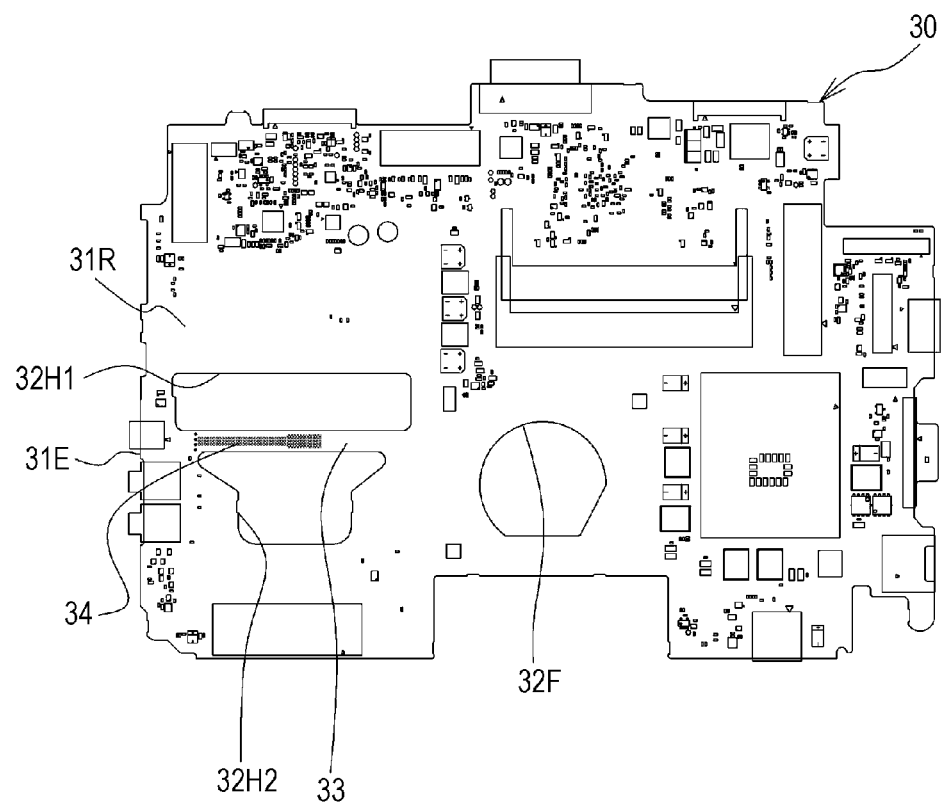
FIG. 9 is a view illustrating a rear surface of the printed circuit board.

FIGS. 8 and 9 illustrate the printed circuit board 30 alone. Specifically, FIG. 8 illustrates the front surface 31F of the printed circuit board 30, whereas FIG. 9 illustrates the rear surface 31R of the printed circuit board 30. The longitudinally extending portion 33 is provided at a location shifted from the center of the printed circuit board 30 and is located close to the edge 31E of the printed circuit board 30. The fan F is provided near the center of the printed circuit board 30. In other words, the distance between the longitudinally extending portion 33 and the center of the printed circuit board 30 is longer than that between the fan F and the center of the printed circuit board 30.

Figure 10:
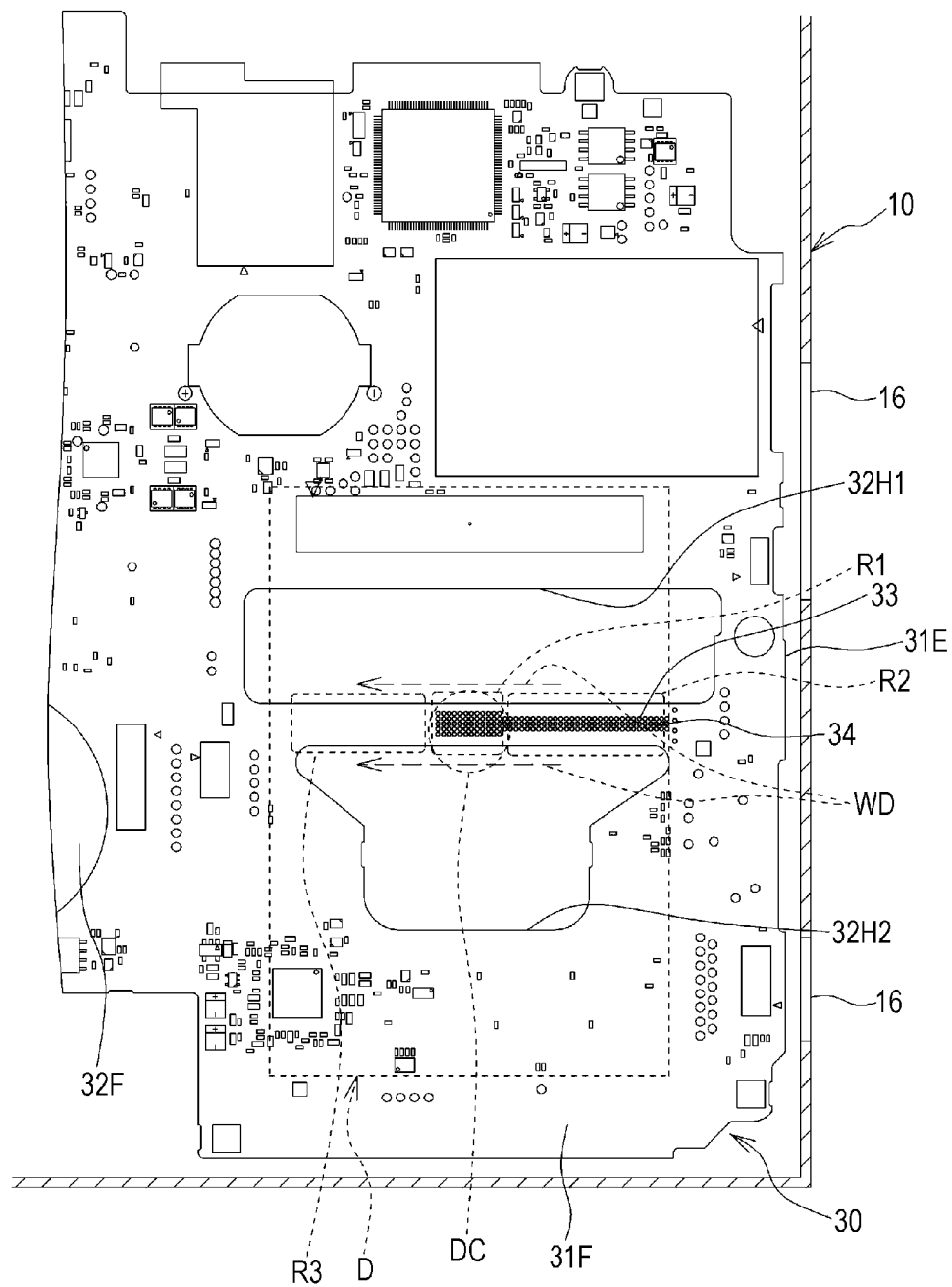
FIG. 10 is an enlarged view illustrating an area around a longitudinally extending portion on the front surface of the printed circuit board.

FIG. 10 is an enlarged view illustrating an area around the longitudinally extending portion 33 as seen from the side of the front surface 31F. The printed circuit board 30 is disposed in the lower casing 10 while having a positional relationship as illustrated in FIG. 10 with the front-side surface of the lower casing 10. Specifically, the printed circuit board 30 is disposed in the lower casing 10, such that the right edge of the printed circuit board 30 as in FIG. 10 is located adjacent to and opposite the front-side surface of the lower casing 10. In FIG. 10, the footprint of the hard disk drive D which is to be disposed on the rear surface 31R of the printed circuit board 30 is indicated by a dotted line. The outlets 16 and 16 are arranged at predetermined locations on the front-side surface of the lower casing 10, such that air which has been introduced into the lower casing 10 by the fan F and is flowing toward the fan F blows onto the hard disk drive D directly.

If various interfaces including the headphone terminal, the microphone terminal and the data communication terminal, and other components are not arranged on the front-side surface of the lower casing 10, as opposed to the arrangement of this embodiment, the outlets 16 and 16 may be replaced by a single outlet formed by coupling the outlets 16 and 16. In this case, the single outlet may be disposed at the location of the interfaces of this embodiment, instead of the outlets 16 and 16. Near the center of the hard disk drive D, an actuator DC is provided for rotating a hard disk. The rotation of the actuator DC increases the temperature of the hard disk drive D. In this case, in particular, the area around the actuator DC becomes hot. The hard disk drive D and the area near the center of the longitudinally extending portion 33 are arranged opposite each other.

The longitudinally extending portion 33 includes a region R1 located near the center of the longitudinally extending portion 33, a region R2 located adjacent to the region R1 and closer to the edge 31E of the printed circuit board 30, and a region R3 located adjacent to the region R1 and closer to the center of the printed circuit board 30. Each of the regions R1 and R2 has multiple through-holes 34 formed therein, whereas the region R3 has no through-holes. The through-holes 34 of the region R1 are aligned in five rows in the lengthwise direction of the longitudinally extending portion 33, whereas the through-holes 34 of the region R2 are aligned in three rows in the lengthwise direction of the longitudinally extending portion 33. Furthermore, the region R2 is longer than the region R1 in the lengthwise direction of the longitudinally extending portion 33. The region R1 is located opposite the actuator DC, or a heat source, of the hard disk drive D.

Figure 11:
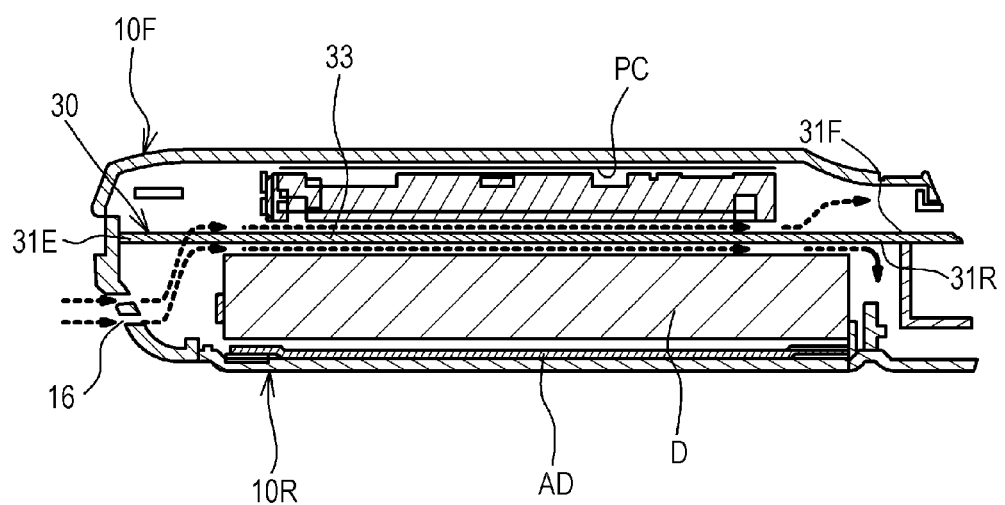
FIG. 11 is a view illustrating a partially cross section of a casing in the notebook computer, for explaining an air flow therein.

FIG. 11 is a view illustrating a partial cross section of the lower casing 10, for explaining an air flow. The hard disk drive D and the card connector PC are arranged so as to sandwich the longitudinally extending portion 33. Due to the suction power of the fan F, external air is introduced into the lower casing 10 through the outlets 16 and 16. Then, the intake air is directed toward the fan F in the lower casing 10 while flowing along the longitudinally extending portion 33. As described above, the air flows above the front surface 31F or the rear surface 31R of the printed circuit board 30 through the openings 32H1 and 32H2. The air sucked by the fan F is directed to the heat sink R. Then, the air passes through the heat sink R, and is exhausted to the outside of the lower casing 10 through the outlet 17.

Figure 12A:
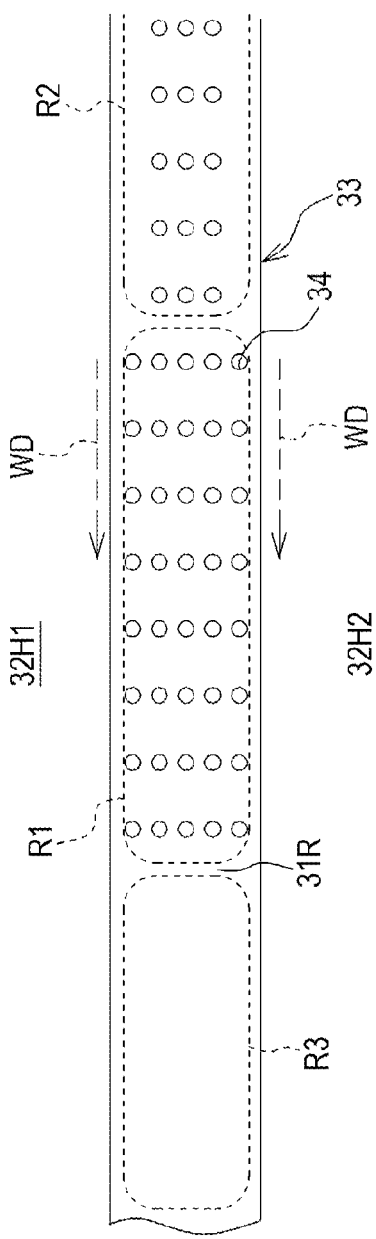
FIG. 12A is an enlarged view illustrating a front surface of the longitudinally extending portion.
Figure 12B:
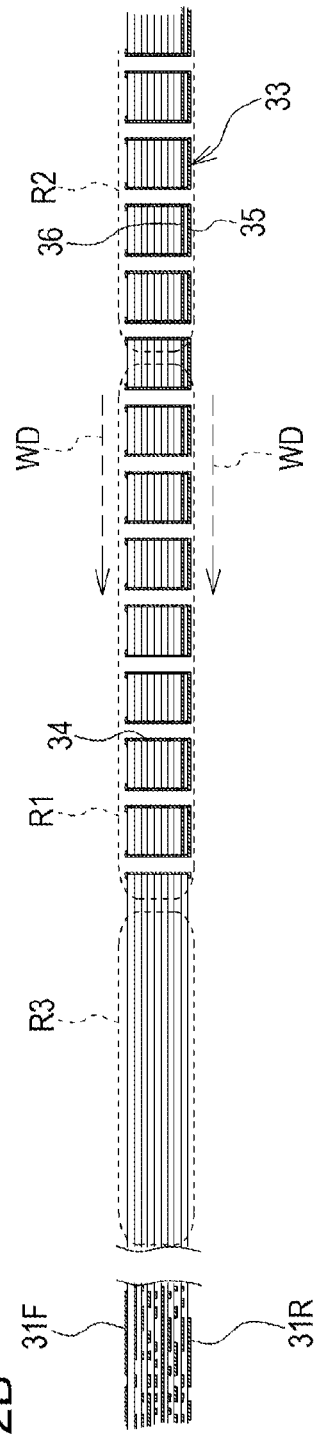
FIG. 12B is a view illustrating a cross section of the longitudinally extending portion.

FIG. 12A is an enlarged view illustrating the longitudinally extending portion 33 as seen from the side of the rear surface 31R. FIG. 12B is a view illustrating a cross section of the longitudinally extending portion 33. As illustrated in FIG. 12B, the printed circuit board 30 is a multilayer wiring board composed of, for example, ten layers. On the area of the rear surface 31R of the longitudinally extending portion 33, a conductive pattern 35 is formed. Accordingly, the conductive pattern 35 faces the hard disk drive D. The conductive pattern 35 is an example of a first conductive pattern. Further, a conductive pattern 36, which is a second layer from the rear surface 31R, is formed. This conductive pattern 36 is an example of a second conductive pattern. Both of the conductive patterns 35 and 36 are formed in the regions R1 and R2. Each of the conductive patterns 35 and 36 is made of copper. The conductive patterns 35 and 36 are connected to each other through the through-holes 34 in a conductive manner. In more detail, the conductive patterns 35 and 36 are connected to copper plating covering the inner side of the through-holes 34. Each of the through-holes 34 penetrates the printed circuit board 30.

In the region R3, neither of through-holes nor conductive patterns are formed. Accordingly, multiple layers made of insulating resin are stacked in the region R3. In other words, in the region R3 which is closer to the center of the printed circuit board 30 than the actuator DC, or a heat source, of the hard disk drive D, no through-holes or conductive patterns are formed. Meanwhile, in both the region R1 that is located opposite the actuator DC and the region R2 that is located closer to the edge 31E of the printed circuit board 30 than the region R1, the through-holes 34 and the conductive patterns 35 and 36 are formed. Note that in the area other than the longitudinally extending portion 33 in the printed circuit board 30, multilayer patterns are formed, as illustrated in FIG. 12B. The patterns in the area other than the longitudinally extending portion 33 in the printed circuit board 30 are used to transmit signals to electronic components and supply electricity thereto.

In general, resins have a thermal conductivity lower than metals. Accordingly, the heat transfer rate of the region R3 is lower than that of the regions R1 and R2. Thus, the heat generated by the hard disk drive D is conducted to the regions R1 and R2 better than to the region R3. This enables the heat conduction direction in the printed circuit board 30 to be controlled by the longitudinally extending portion 33. Note that the longitudinally extending portion 33 extends to the edge 31E of the printed circuit board 30. Moreover, the regions R1 and R2 having the through-holes 34, etc. are located close to the edge 31E of the printed circuit board 30, whereas the region R3 having no through-holes is located close to the center of the printed circuit board 30. Therefore, the heat conduction direction in the printed circuit board 30 is controlled in such a way that the heat is conducted to the edge 31E. Consequently, the conduction of the heat from the hard disk drive D to the center of the printed circuit board 30 is restricted.

The fan F causes air to flow along the longitudinally extending portion 33 in the direction WD. This facilitates heat dissipation in the regions R1 to R3. As described above, because the thermal conductivity of the region R3 is lower than that of the regions R1 and R2, the regions R1 and R2 dissipate heat to the surrounding air better than the region R3 does. Accordingly, when the heat dissipation in the regions R1 to R3 is facilitated, the amount of temperature decrease of the regions R1 and R2 tends to increase more than that of the region R3. In general, heat is conducted from a hotter portion to a cooler portion. Thus, the facilitation of heat dissipation in the regions R1 to R3 causes the heat of the hard disk drive D to be transferred to the regions R1 and R2 better than to the region R3. Consequently, the heat conduction direction in the printed circuit board 30 is controlled in such a way that the heat is transmitted to the edge 31E.

The region R2 is located upstream of the region R1 in the direction of the air flow. In addition, the region R1 is located close to the actuator DC, or a heat source, of the hard disk drive D, and the region R2 is located farther from the actuator DC than the region R1 is. Due to this arrangement, the region R2 cools easier than the region R1 does, and the temperature of the region R2 becomes lower than that of the region R1, thus causing a difference in temperature between the regions R1 and R2. Specifically, this temperature difference also occurs in the conductive patterns 35 and 36. Since heat transfers from a hotter portion to a colder portion, the heat of the hard disk drive D is better conducted from the region R1 to the region R2. In this way, the heat conduction direction in the printed circuit board 30 is controlled in such a way that the heat is transmitted to the edge 31E.

The temperature difference between the regions R1 and R2 is also caused due to the air flow produced by the fan F. External air is introduced into the lower casing 10 through the outlets 16 and 16 by the fan F, and flows over the regions R2 and R1 in this order. In this case, the air flowing over the region R1 has absorbed heat from the region R2. Therefore, the region R2 dissipates heat more efficiently than the region R1 does. Furthermore, since the region R1 is located close to the actuator DC, or a heat source, of the hard disk drive D, and the region R2 is located farther from the actuator DC than the region R1 is, the region R1 is less prone to being cooled than the region R2 is. As described above, the difference between the temperatures of the region R1 with and without an air flow is less than that of the region R2. Further, the difference in temperature between the regions R1 and R2 when the air flows is greater than that when air does not flow. Thus, since the longitudinally extending portion 33 extends in the direction of the air flow produced by the fan F, the heat dissipation in the region R2 is facilitated in comparison with the heat dissipation in the region R1, so that the difference in temperature between the regions R1 and R2 increases. This makes it possible to control the heat conduction direction in the printed circuit board 30. Note that as to the actual temperature distribution of the regions R1 and R2, the temperature of the regions decreases with distance from the actuator DC.

As described above, in this embodiment, the heat conduction direction in the printed circuit board 30 is controlled in such a way that the heat transfers to the edge 31E of the printed circuit board 30. In fact, many electronic components tend to be mounted on an area around the center of the printed circuit board 30 according to this embodiment. Therefore, air flow caused by the fan F does not flow over the area around the center of the printed circuit board 30 smoothly, and therefore, the heat dissipation efficiency in this area is lower than that at the edge 31E. For this reason, when the heat is conducted to the center of the printed circuit board 30, the temperature of the printed circuit board 30 increases. Further, the temperature of the interior of the lower casing 10 may also increase. In this case, the notebook computer may forcibly shut down the power, in order to avoid the thermal runaway in the CPU 40. In contrast, the notebook computer 1 according to this embodiment restricts the temperature rise of the printed circuit board 30 and the interior of the lower casing 10, by controlling the heat conduction direction in the printed circuit board 30 in such a way that the heat of the hard disk drive D transfers to the edge 31E.

Since the longitudinally extending portion 33 is located between the openings 32H1 and 32H2, air that is passing through the openings 32H1 and 32H2 facilitates the heat dissipation of the longitudinally extending portion 33. Furthermore, the hard disk drive D is partially exposed from the openings 32H1 and 32H2 of the printed circuit board 30, so as to be viewable from the rear surface 31R of the printed circuit board 30. This makes it easier to direct air to the part of the hard disk drive D which is exposed from the openings 32H1 and 32H2, thereby facilitating the heat dissipation in the whole hard disk drive D. Moreover, since the longitudinally extending portion 33 extends in the direction WD of the air flow, the air flows along the front and rear surface of the longitudinally extending portion 33 without being subjected to significant resistance by the longitudinally extending portion 33. This improves the efficiency of heat dissipation in the longitudinally extending portion 33.

Moreover, the air passing through the through-holes 34 facilitates heat dissipation in the conductive patterns 35 and 36.

As illustrated in FIG. 11, since the longitudinally extending portion 33 is not in contact with any of the actuator DC and the card connector PC, the transfer of heat from the longitudinally extending portion 33 to surrounding air is facilitated. In addition, as illustrated in FIG. 10, the parts of the opening 32H1 are not overlaid with the hard disk drive D. Accordingly, since air may pass through this non-overlaid parts of the opening 32H1, the air above the front surface 31F of the printed circuit board 30 which has been introduced into the lower casing 10 through the outlets 16 easily flows along the surface of the hard disk drive D which is opposite the printed circuit board 30. This improves the efficiency of the heat dissipation of the hard disk drive D itself.

The two layers of the conductive patterns 35 and 36 formed in the longitudinally extending portion 33 increases the amount of heat which the longitudinally extending portion 33 may absorb. Accordingly, the longitudinally extending portion 33 may absorb an adequate amount of heat, despite the small area thereof.

Since located opposite the actuator DC, or a heat source, of the hard disk drive D, the longitudinally extending portion 33 may absorb the heat of the hard disk drive D efficiently.

Up to this point, the preferable examples of this embodiment have been described. However, the embodiment is not limited to specific examples, and various modifications and variations to the embodiment may be made without departing from the spirit and scope of the claims.

For example, the heat-generating component, or the hard disk drive D, is located near the printed circuit board 30 without being mounted thereon. However, the arrangement of the heat-generating component is not limited thereto. Alternatively, the heat-generating component may be mounted on the printed circuit board 30 directly. The heat-generating component may be a semiconductor chip, a coil, a switching element, or the like. For example, a semiconductor chip may be, but is not limited to, a CPU, a GMCH (graphics memory controller hub), or a graphic card. The heat-generating component may be a drive source that performs driving physically by receiving electric power, just like an actuator, or a device equipped with such a drive source.

Although the embodiment has been described by citing an example in which the electronic device is a notebook computer, the electronic device may be any other device. For example, the electronic device may be a tablet computer, a portable telephone, a portable TV, an electronic dictionary, a PDA (personal digital assistance), a game device, a camera, a music player, a navigation device or the like. In addition, the electronic device may not be limited to such a portable type electronic device, but may be a mounted type electronic device. For example, the electronic device may be a desktop computer, a monitor for a desktop computer, a monitor with a built-in computer, a TV, an audio system, or any other home electronic appliance.

The conductive pattern 36 may be formed in any layer of the printed circuit board 30, unless formed in the same layer as the conductive pattern 35 is formed. In addition, the conductive pattern 36 may be formed in a layer on the front surface 31F. Furthermore, one or more additional patterns may be formed in layer or layers other than the layers in which the conductive patterns 35 and 36 are formed.

The air flow produced by the fan F may be set such that the air flows along the longitudinally extending portion 33 in a direction from the fan F to the edge 31E of the printed circuit board 30.

Although the through-holes 34 are provided as a way of connecting the conductive patterns 35 and 36, this connecting method is not limited to the through-holes 34. Alternatively, blind via holes or surface via holes may be employed instead of the through-holes 34.

The independent openings 32H1 and 32H2 formed in the printed circuit board 30 may be replaced by a single opening formed by connecting the openings 32H1 and 32H2 through the respective parts thereof. In this case, one end of the longitudinally extending portion 33 which is closer to the edge 31E of the printed circuit board 30 may be connected to the printed circuit board 30, whereas the other end thereof may be a free end. In this structure, the heat transfer from the hard disk drive D (particularly, from the actuator DC) to the center of the printed circuit board 30 is restricted by the free end of the longitudinally extending portion 33.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic device comprising:
   a printed circuit board;
   a heat generating component disposed on the printed circuit board; and
   a casing including the printed circuit board and the heat generating component, the casing allowing an air flow to flow from an outside of the casing to an inside of the casing,
   wherein:
      the printed circuit board includes a first opening, a second opening, and an extending portion formed between the first and second openings so as to extend in a flow direction of the air flow in the casing,
      the extending portion has a length that extends in the flow direction of the air flow,
      the extending portion includes a conductive pattern and is located opposite the heat generating component,
      the conductive pattern includes a first conductive pattern, a second conductive pattern, and a plurality of coupling holes,
      the first conductive pattern is formed on and parallel to a first outer surface of the printed circuit board that faces the heat generating component,
      the second conductive pattern is formed on and parallel to an inner layer of the printed circuit board that is disposed between the first outer surface and a second outer surface of the printed circuit board that faces opposite the first outer surface such that the second outer surface faces away from the heat generating component,
      the plurality of coupling holes are disposed along the length of the extending portion at a plurality of locations and couple the first conductive pattern with the second conductive pattern at the plurality of locations, and
      a number of coupling holes per unit area of the extending portion is larger in a first portion of the extending portion than in a second portion of the extending portion, wherein the first portion is closer to the heat generating component than the second portion.

2. The electronic device according to claim 1, further comprising:
   an inlet formed on the casing, the inlet being opposite an edge of the printed circuit board; and
   a fan that generates the air flow through the inlet,
   wherein the extending portion extends in a direction from the fan to the edge.

3. The electronic device according to claim 1, wherein the first and second openings form a single opening in which the first and second openings are connected by a third opening.

4. The electronic device according to claim 1, wherein the first and second openings are formed discretely from each other.

5. The electronic device according to claim 1, wherein the heat generating component is partially exposed to one of the first and second openings so that the heat generating component is viewable in a direction from the second surface of the printed circuit board.

6. The electronic device according to claim 1, wherein the extending portion includes a first portion and a second portion, the first portion is located closer to an edge of the printed circuit board than the second portion, the first portion is located farther from a center of the printed circuit board than the second portion, the first portion includes the conductive pattern, and the second portion includes an absence of the conductive pattern.

7. The electronic device according to claim 2, wherein the extending portion includes a first portion and a second portion, the first portion is located closer to the edge of the printed circuit board than the second portion, the first portion is located farther from a center of the printed circuit board than the second portion, the first portion includes the conductive pattern, and the second portion includes an absence of the conductive pattern.

8. The electronic device according to claim 1, wherein the plurality of coupling holes include one or more coupling holes selected from a group of coupling holes that includes: a through hole, a blind via hole, and a surface via hole.

9. An electronic device comprising:
   a printed circuit board;
   a heat generating component disposed on the printed circuit board; and
   a casing including the printed circuit board and the heat generating component, the casing allowing an air flow to flow from an outside of the casing to an inside of the casing,
   wherein:
      the printed circuit board includes a first opening, a second opening, and an extending portion formed between the first and second openings so as to extend in a flow direction of the air flow in the casing,
      the extending portion has a length that extends in the flow direction of the air flow;
      the extending portion includes a conductive pattern and is located opposite the heat generating component,
      the conductive pattern is built to draw heat generated by the heat generating component along the length of the extending portion and away from the inside of the casing and toward the outside of the casing,
      the conductive pattern includes a first conductive pattern, a second conductive pattern, and a plurality of coupling holes,
      the first conductive pattern is formed on and parallel to a first outer surface of the printed circuit board that faces the heat generating component,
      the second conductive pattern is formed on and parallel to an inner layer of the printed circuit board that is disposed between the first outer surface and a second outer surface of the printed circuit board that faces opposite the first outer surface such that the second outer surface faces away from the heat generating component, the plurality of coupling holes are disposed along the length of the extending portion at a plurality of locations and couple the first conductive pattern with the second conductive pattern at the plurality of locations, and a number of coupling holes per unit area of the extending portion is larger in a first portion of the extending portion than in a second portion of the extending portion, wherein the first portion is closer to the heat generating component than the second portion.

* * * * *